United States Patent [19]
Levine

[11] 3,953,733

[45] Apr. 27, 1976

[54] METHOD OF OPERATING IMAGERS

[75] Inventor: Peter Alan Levine, Trenton, N.J.

[73] Assignee: RCA Corporation, New York, N.Y.

[22] Filed: May 21, 1975

[21] Appl. No.: 579,690

[52] U.S. Cl. ............................ 250/330; 357/24
[51] Int. Cl.² ........................................ H01J 31/49
[58] Field of Search .......... 250/330, 332, 334, 338; 357/24, 30; 307/221 D, 311

[56] References Cited
UNITED STATES PATENTS

| | | | |
|---|---|---|---|
| 3,845,295 | 10/1974 | Williams et al. | 357/24 |
| 3,883,437 | 5/1975 | Nommedal et al. | 250/332 |

*Primary Examiner*—Davis L. Willis
*Attorney, Agent, or Firm*—H. Christoffersen; Samuel Cohen

[57] ABSTRACT

During the integration time, the voltage applied to the electrodes of a charge coupled device (CCD) imager under which radiation induced charges are to be collected is changed as a function of time. To obtain dark current reduction, a linear ramp may be employed which starts at a relatively low voltage level. The lower average voltage employed to collect charge signals results in lower dark currents (especially at locations where defects are present) but does not appreciably change the number of radiation induced charge carriers which are collected. To obtain increased dynamic range, the voltage may be changed in nonlinear fashion, for example, increased in discrete steps or increased by changing the slope of the voltage waveform. Similar techniques may be employed for gamma ($\gamma$) correction.

27 Claims, 17 Drawing Figures

PRIOR ART

IMPROVED MODE OF OPERATION

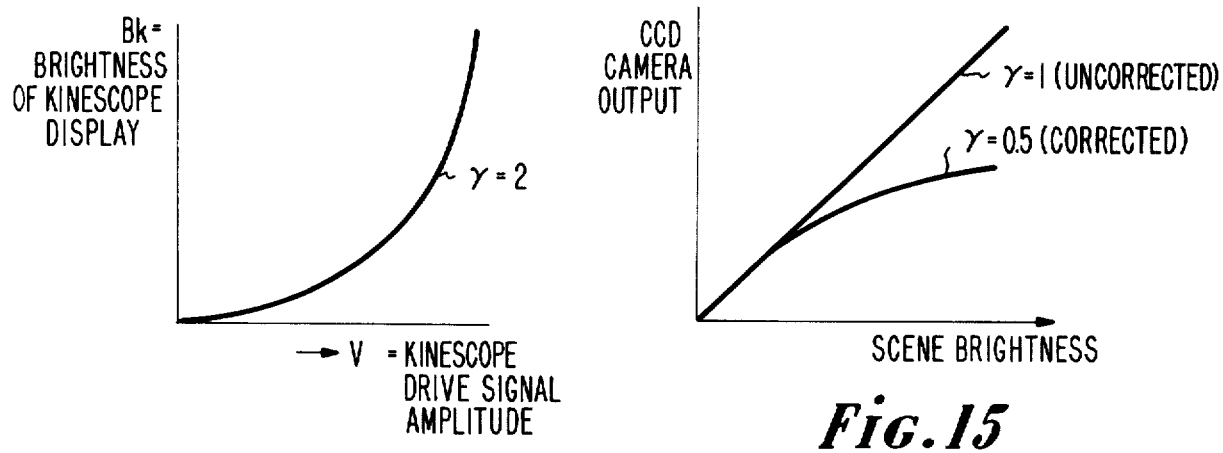
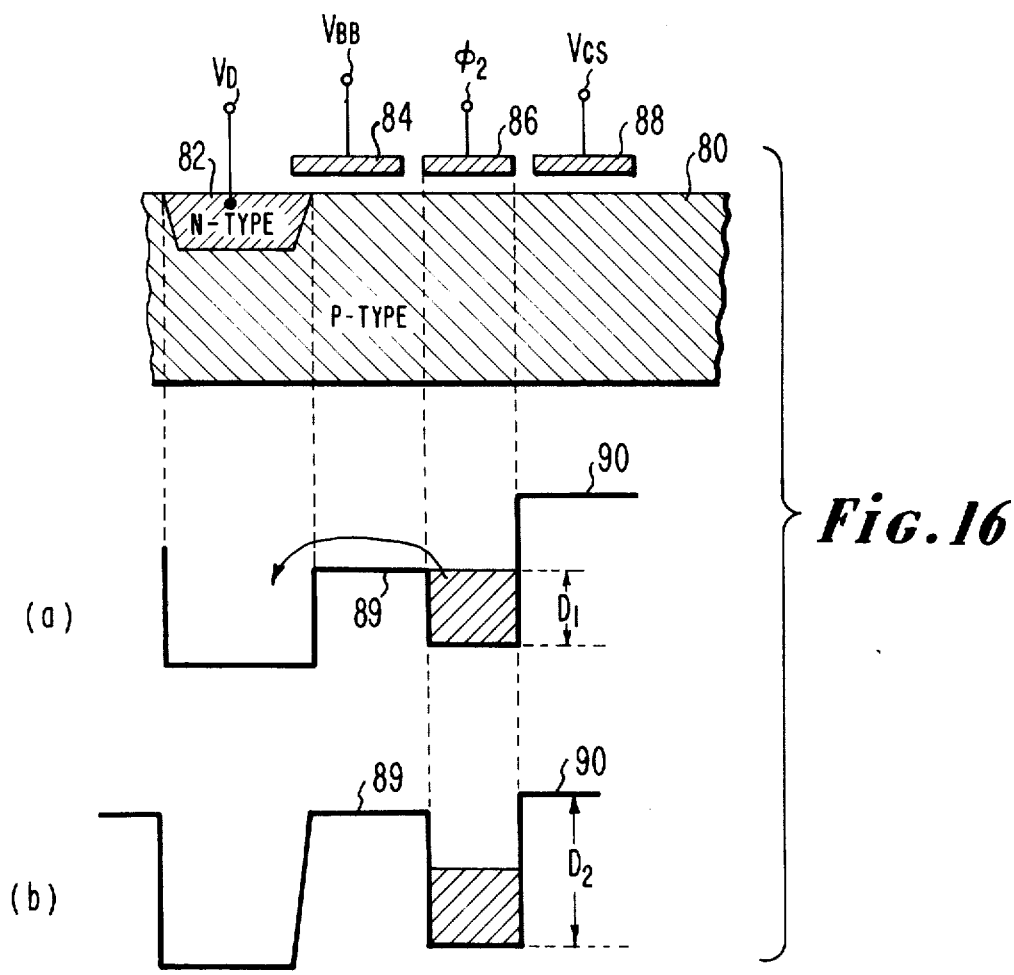

METHOD OF OPERATING IMAGERS

The present invention relates to methods of operating imagers such as (CCD) imagers.

Improved performance is achieved by changing during the integration time, the capacity of the charge storage means at each location of the imager.

In the drawing:

FIG. 14 is a plot of brightness verses drive signal amplitude for a kinescope;

FIG. 15 shows the output of a CCD camera which in one case is corrected for gamma and in another case, is uncorrected; and FIG. 16 is a section transverse of a CCD channel of an imager and illustrates also certain substrate surface potential profiles during the integration time.

Figure 1:
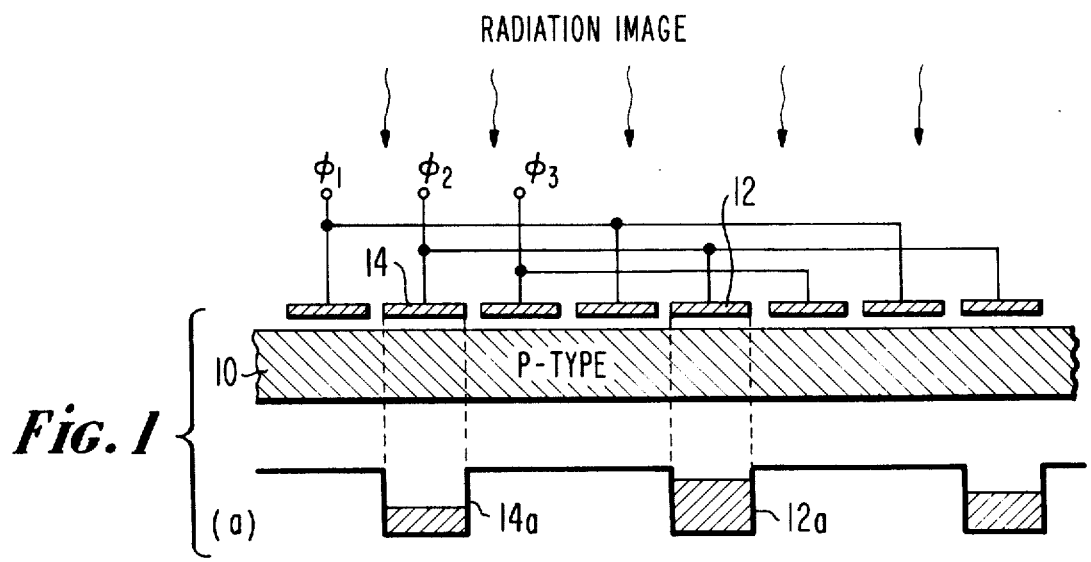
FIG. 1 is a section through a CCD channel of a three-phase imager and illustrates also the substrate surface potential profile during the integration time.

Referring first to the upper portion of FIG. 1, the CCD imager shown includes a P-type substrate 10 and a plurality of electrodes insulated from and capacitively coupled to the substrate. The showing is schematic in the sense that the insulation employed, which is normally silicone dioxide, is not shown specifically and the electrode structure is shown only schematically. The type of CCD chosen for illustration is a three phase device and in a practical circuit, the electrodes may overlap one another or may be side-by-side, as shown with, for example, insulation in the gaps between electrodes. The present invention is applicable also to two or four or higher phase structures which are not illustrated specifically. Also, the substrate may be of N-type rather than P-type, provided supply voltages are chosen of appropriate polarity.

The structure shown in FIG. 1 may be assumed to constitute a portion of one vertical channel of the image sensing region of the array, sometimes also known as the A register. During one portion of the operating time, known as the "integration" time, when a scene is being imaged onto the array, one of the electrodes of each stage (the $\phi_2$ electrodes in the example) may be maintained at a fixed voltage level to cause depletion regions to form beneath such electrodes and the remaining electrodes, namely the $\phi_1$ and $\phi_3$ electrodes, may be maintained at potentials such as to maintain the substrate regions beneath these electrodes in mild depletion or in slight accumulation. This is illustrated at $a$ in FIG. 1. (Alternatively, two electrodes of each stage may be maintained at a potential to form deep depletion regions and the third at a potential to maintain the substrate in mild depletion or in slight accumulation.) The heavily depleted regions form potential wells in the substrate, that is, they form regions at the substrate surface from which majority carriers (holes) have been repelled and where minority carrier surface charge (electrons) may accumulate. The lightly depleted (or mildly accumulated) regions of the substrate form potential barriers between the potential wells.

In operation, a radiation image is applied to the imager either through the electrodes, as illlustrated schematically, or through the back surface of the substrate. (It may be assumed for purposes of the present discussion that, if front surface illumination is employed, the electrodes are substantially transparent to the radiation.) Charges accumulate in the various potential wells in accordance with the radiation intensity reaching the substrate in the region close to the respective $\phi_2$ electrode locations. As illustrated in FIG. 1($a$), the radiation intensity in the region of electrode 12 is greater than that in the region of electrode 14 so that more charge carriers accumulate in potential well 12$a$ than in potential well 14$a$. The charge carriers in the example illustrated are electrons.

Figure 2:
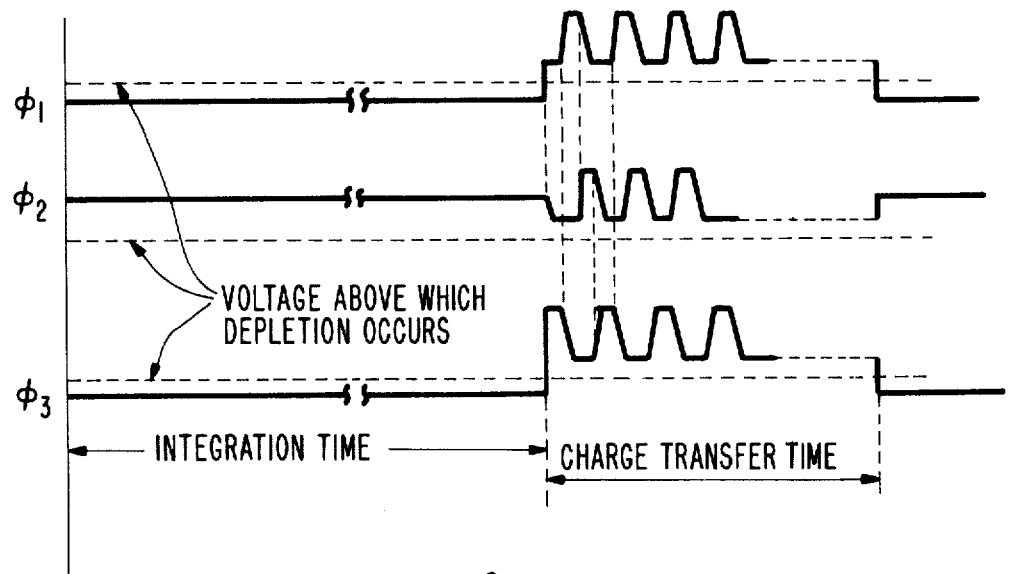
FIG. 2 is a drawing of waveforms to help explain the operation of the imager of FIG. 1.

FIG. 2 illustrates the waveforms which are employed. During the integration time, the $\phi_2$ voltage is at a fixed level such that depletion regions are formed. The $\phi_1$ and $\phi_3$ electrodes are at a fixed lever and in the present illustration that level is such that the regions of the substrate beneath these electrodes are in mild accumulation. It is advantageous to operate in this way to achieve what is known as "operational blooming control." Alternatively, the $\phi_1$ and $\phi_3$ voltage levels may be somewhat higher (more positive) such that the regions of the substrates beneath these electrodes are in mild depeletion.

The integration time may be relatively long, somewhat under 1/60'th of a second in the case of commercial television. Upon the termination of the integration time, the charges stored in the imager are transferred to a so called B register (a temporary storage array) and from the B register transferred a row at a time to a C register. The transfer of charge from the A to the B register is accomplished by the multiple phase voltages shown during the vertical retrace period which may be some 900 microseconds or so.

Figure 3:
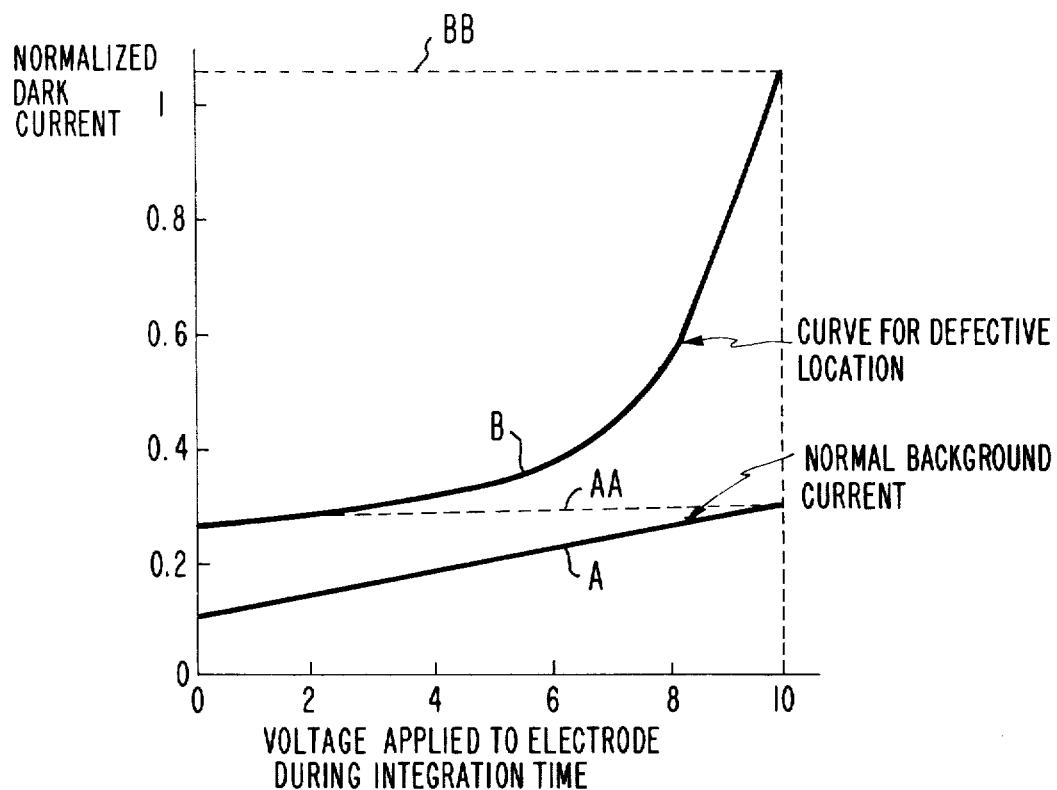
FIG. 3 is a graph of dark current as a function of the voltage applied to a transfer electrode.

A problem which exists in imagers of the type under discussion is so-called dark current defects. Such a defect refers to a location or locations of the imager which generates substantial numbers of charge carriers, even in the absence of radiation excitation. In normal operation such defects appear as intense white spots in the reproduced picture. It is believed that such defects are a result of the thermal generation of charge carriers. However, regardless of their origin, it has been found that dark currents produced are extremely sensitive to the amplitude of the applied electric field and this, in turn, is proportional to the voltage applied to the electrodes during the integration time. The graph of FIG. 3 illustrates this. At a normal location the dark current, legended "normal background current," varies with applied voltage as shown by the solid line curve A. Where a defect is present, however, the dark current varies with voltage in the manner shown by solid line curve B. Note the exponential increase in dark current with applied voltage.

As already mentioned, it is known in the art to operate the electrodes in the manner shown in FIG. 2, that is, with a constant voltage level applied, during the integration time, to the electrodes (the $\phi_2$ electrodes in this example) under which charge signals are to be stored. When so operated in the absence of radiation induced signal, a $\phi_2$ electrode at +10 volts at a normal location will cause a charge level as shown at AA in FIG. 3 to accumulate; however, a $\phi_2$ electrode at +10 volts over a portion of the surface where a defect is present, will cause a charge level as illustrated by dashed line BB, in FIG. 3 to accumulate.

Figure 4:
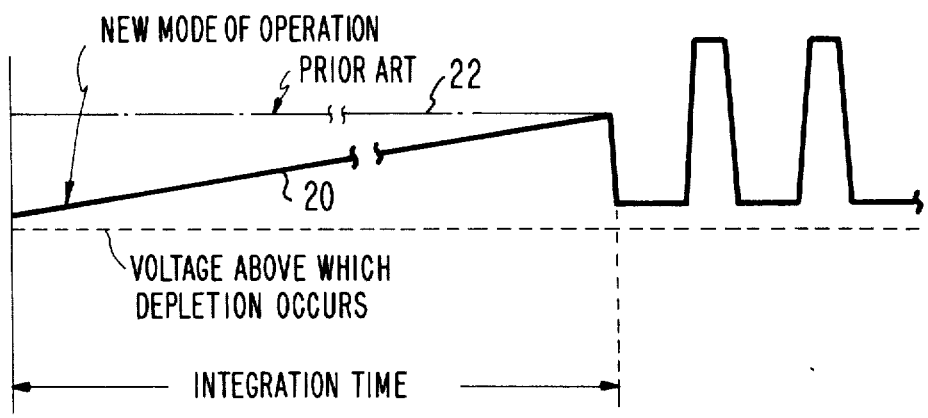
FIG. 4 is a drawing of the waveform employed to obtain the improved operation discussed in the present application.

In accordance with one aspect of the present invention, rather than applying a fixed voltage level to the charge accumulation electrodes during the integration time, as in the prior art, a voltage is applied which starts at a low level and which increases as a function of time in a manner to cause the substrate potential to increase linearly with time. For purposes of illustration, the voltage itself is illustrated as a linear ramp; however, it is to be understood that it may, in practice, be slightly non-linear to the extent required by the substrate doping employed. Such a wave is shown in FIG. 4 by the solid line 20. The previously known way of operating is illustrated by the dot dash line 22. When using a linear ramp voltage such as 20, the charge which will accumulate at any location due to dark current is proportional to the area under the solid curves of FIG. 3. In the case of a defective location, the area under the solid curve B is only about one third that under the dashed curve BB and indeed it has been shown empirically that this kind of improvement is achieved. The test was made using a three phase CCD imager having 256 by 160 locations and operated with the regions between potential wells in light depletion during the integration time. During this test it was found that the resolution and potential well size were unaffected by the use a ramp voltage. There was a small decrease in sensitivity to light, probably due to a decrease in the average size of the depletion region. This should only be a second order effect for imagers with long carrier diffusion length compared with depletion size.

It may be observed in FIG. 3 that the normal background current is slightly reduced employing the technique just described. In other words, the area under curve A is somewhat smaller than that under curve AA.

Figure 5:
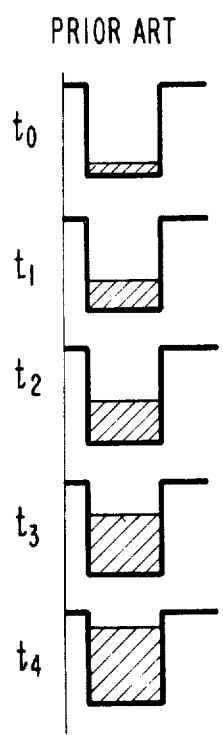
FIG. 5 is a drawing of a potential well beneath a charge accumulation electrode during successive times in an integration interval, when that electrode is maintained at a fixed potential, as is done in the known art.
Figure 6:
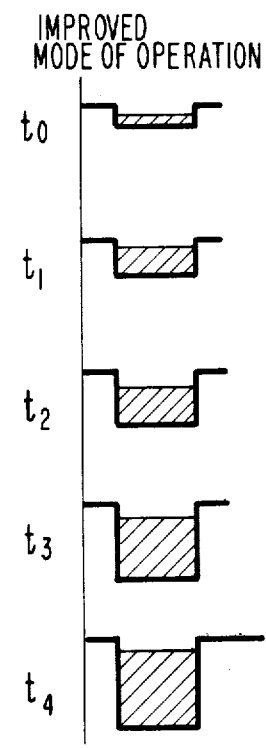
FIG. 6 is a drawing showing the operation under the same conditions as in FIG. 5 but using the mode of operation suggested herein.

One might believe, on first consideration, that operation in the way just described could substantially decrease the number of charge signal carriers collected during the integration time. However, upon further analysis, as carried out in FIGS. 5 and 6, it should become clear that no such appreciable decrease will occur. The times $t_0$ through $t_4$ in FIGS. 5 and 6 represent successive times during an integration period. In the prior art, as shown in FIG. 5, the potential well remains of the same size during the successive periods in view of the fact that the voltage applied to the electrode (not shown) causing this potential well remains at a constant level. However, during succeeding periods, more and more charge signal accumulates in this well of fixed size.

FIG. 6 illustrates the performance obtained employing a linear ramp during the integration time as shown in FIG. 4. While at time $t_0$, for example, the size of the well is considerably smaller (shallower) than in the prior art, the amount of charge signal which has to be accumulated also is relatively small. Accordingly, it can be accumulated even in this shallow well. However, at the relatively low voltage involved, not much dark current is generated, even if a defect is present, as is clear from FIG. 3. As time passes, more and more charge becomes available but the depth of the well also increases with time. Accordingly, with proper choice of the slope of the ramp voltage, the well size can be made always to be adequate to accommodate the charge which is being generated, and as the higher voltages are employed for only a relatively smaller portion of the integration time than in the prior art, the dark currents generated at defective locations are considerably smaller than in the prior art.

In the case of a very bright spot such that a well overflows, there may be the problem of blooming. However, if the substrate surface between potential wells is in light accumulation, the excess charge carriers which overflow the well will recombine with the majority carriers present in the lightly accumulated regions and be disposed of in this way. This in itself is the known so-called operational blooming control.

Figure 7:
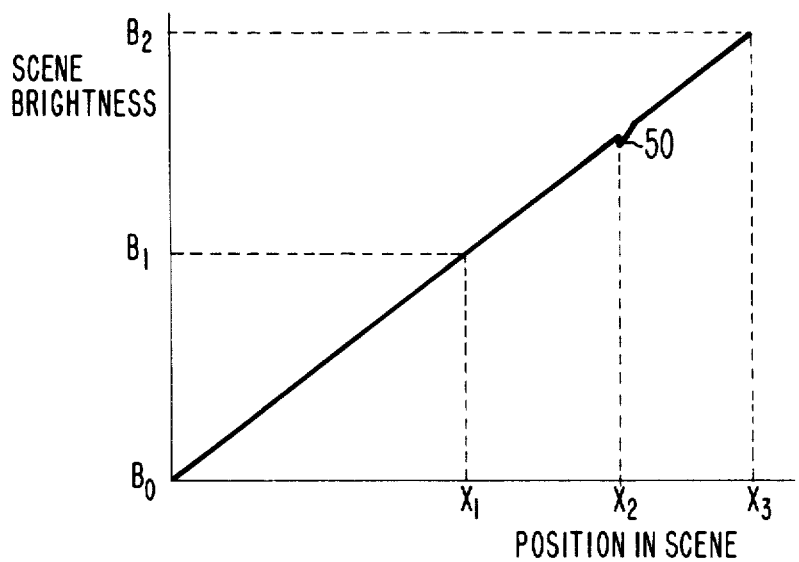
FIG. 7 is a graph of scene brightness verses position under an assumed set of circumstances.
Figure 8:
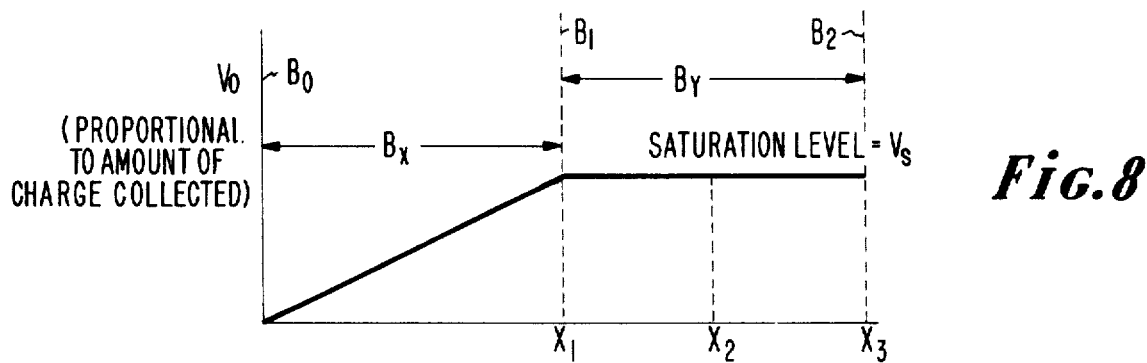
FIG. 8 is a graph illustrating the video output obtained at successive locations along one row of an imager under the conditions of FIG. 7.

FIGS. 7 and 8 illustrate another problem which may occur during the operation of a CCD imager in the conventional way, that is, with the waveforms shown in FIGS. 2 and 3. FIG. 7 is a plot of scene brightness verses position in the scene, for an assumed image along one direction of an array. The scene brightness is assumed to increase linearly as a function of position. At some arbitrary position $x_2$, there is perturbation in the brightness level, shown as a sudden decrease in brightness.

Assume now that the voltage applied to the $\phi_2$ electrodes is constant at some level $V_2$. Assume also that a scene brightness of greater than $B_1$ is sufficient to cause a potential well to overflow. The result of operating under these conditions is shown in FIG. 8. At brightness levels up to $B_1$, the amount of charge collected in a potential well is proportional to the brightness level and the video output voltage $V_O$, which is proportional to the amount of charge signal collected, therefore is also proportional to the brightness level. Thus, for all brightness levels between $B_0$ and $B_1$, the CCD imager will produce an output $V_O$ which is linearly proportional to the brightness. However, when the brightness becomes greater than $B_1$, the potential well overflows. The excess charge carriers will combine with the majority carriers present under the $\phi_1$ and $\phi_3$ electrodes and be disposed of in this way (assuming that operational blooming control is being employed as illustrated in FIG. 2). Alternatively, structural blooming control buses may be employed for removing the excess charge to prevent blooming.

The dynamic range of the imager corresponds to some range of brightness $B_X = B_0$ to $B_1$ of FIG. 8. While $B_0$ is shown at the origin of the curve for the sake of convenience, it will be understood that $B_0$ is intended to represent the minimum useful brightness level. It is always greater than zero and its actual value is a function of the noise characteristics of the particular imager. (It should be kept in mind that although the abcissa of the graph of FIG. 8 is distance, since the brightness varies linearly with distance in the example assumed for purposes of this discussion, the abcissa also represents the brightness level). Above the brightness level $B_1$ and indeed over the entire range $B_Y$, the potential wells are saturated (full of charge) and the video output voltage $V_O$ is at a constant level of $V_S$. Referring to FIG. 8, no detail can be discerned in the brightness range $B_1$ to $B_2$. It is not possible, for example, to see the perturbation 50 of FIG. 7.

Figure 9:
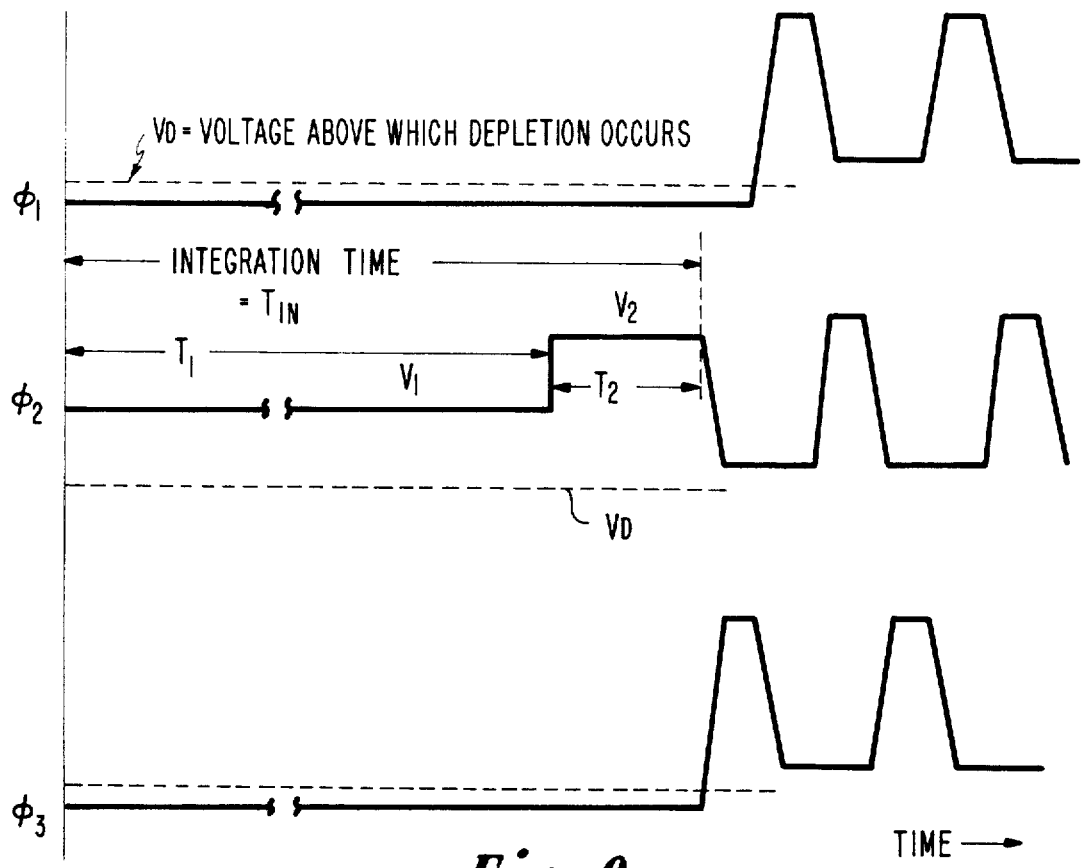
FIG. 9 is a drawing of waveforms to illustrate how dynamic range can be increased.

The dynamic range of the imager may be greatly improved (increased) in accordance with a second aspect of the invention by operating in the way illustrated in FIG. 9. The $\phi_1$ and $\phi_3$ voltages are similar to the corresponding voltages of FIG. 2. The $\phi_2$ voltage is different. During the major portion $T_1$ of the integration time, the $\phi_2$ voltage is at one level $V_1$ and during the remainder $T_2$ of the integration time, the $\phi_2$ voltage is at a second, higher level $V_2$. With the proper selection of the respective amplitudes of $V_1$ and $V_2$ and the durations of the periods $T_1$ and $T_2$ during which the voltages $V_1$ and $V_2$ are applied, the dynamic range can be greatly extended.

Figure 10:
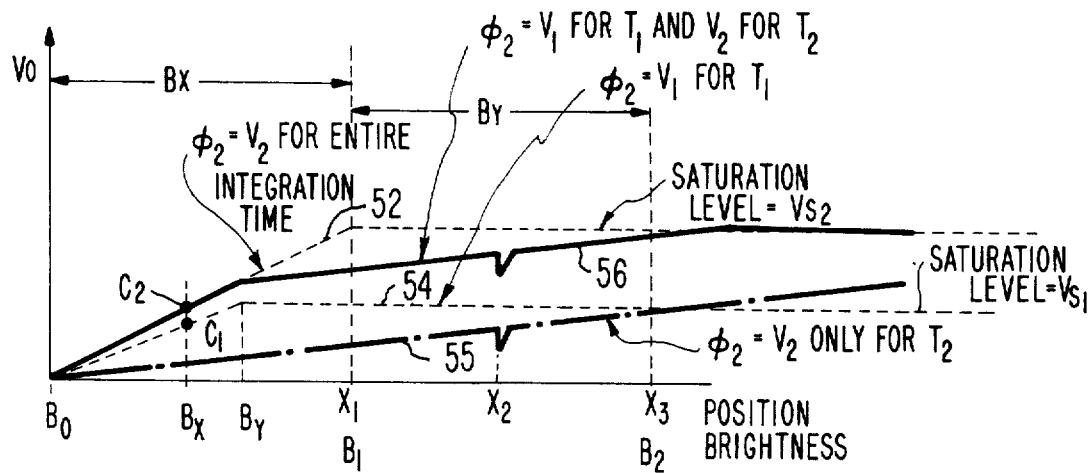
FIG. 10 illustrates the same variables as FIG. 8 but obtained using the waveforms of FIG. 9.

The above is illustrated in FIG. 10. The dashed line 52 corresponds to the curve of FIG. 8. It represents the amplitude of the video output $V_O$ as a function of brightness level for the case in which the $\phi_2$ voltage is at a constant level $V_2$ for the entire integration time. The dashed line 54 shows the video output voltage $V_O$ which would be obtained if the $\phi_2$ electrodes were held at a constant level $V_1$ for the portion $T_1$ of the integration time. The slope of curve 54 is proportional to the fraction $T_1/(T_1+T_2)$. That is, the greater the fraction of the integration time occupied by $T_1$, the closer will be the slope of the ramp portion of curve 54 to that of 52. In a qualitative way, the slope indicates the number of charge carriers which will be collected at a location, in response to a given brightness level, during the entire period $T_1$. The greater $T_1$, of course, the greater the number of carriers collected, at a given brightness level. Thus, at brightness level $B_X$, some number of carriers $C_1$ will be collected during $T_1$ (curve 54) and during the total time $T_1 + T_2$, a greater number of carriers $C_2$ would be collected.

When operating at voltage $V_1$ the potential wells become full at brightness level $B_Y$. Thus, the video output voltage for this and higher levels saturate at the constant level $V_{S1}$ when the voltage $V_1$ is applied to the $\phi_2$ electrodes (curve 54).

Curve 55 illustrates the video output obtained by operating the $\phi_2$ gate electrodes at the potential $V_2$ for the relatively short period $T_2$. The slope of this curve is proportional to $T_2/(T_1+T_2)$ and the saturation level is $V_{S2}$. It may be observed that saturation in this particular example is not obtained except at extremely high brightness levels (they would be off scale). Of course, this is an example only as the inventive teachings are applicable to longer time periods than shown for $T_2$ (or shorter ones, if desired).

The solid line curve 56 shows the performance obtained using the two level waveform shown in FIG. 9. It is obtained by adding curve 55 to curve 54. For brightness levels from $B_0$ to $B_1$ (during time $T_1$), an output voltage $V_0$ is obtained which is proportional to this brightness. Any brightness level would tend to produce a video level greater than $V_{S1}$ during the integration time $T_1$, causes saturation of a potential well and the excess charge is removed in the manner already described. At the end of time $T_1$, the potential wells are made deeper by changing the voltage $V_1$ to $V_2$. This immediately terminates any blooming which may be present. And it permits the accumulation of additional charge carriers in the potential wells for the relatively short interval $T_2$. Thus, if at a particular location such as $X_2$, a potential well formerly was full, since the well has been made deeper, it can now accumulate more charge. Provided that the scene is not so bright that this particular well will overflow during $T_2$, the total charge accumulated will be proportional to the actual brightness at that particular location. So in FIG. 10 it may be observed that at position $X_2$ the small perturbation in the brightness level is visible. The dynamic range, in effect, has been extended from its former range $B_X = (B_0$ to $B_1)$ to $B_X + B_Y = ($a range $B_0$ to $B_2)$.

Figure 11:
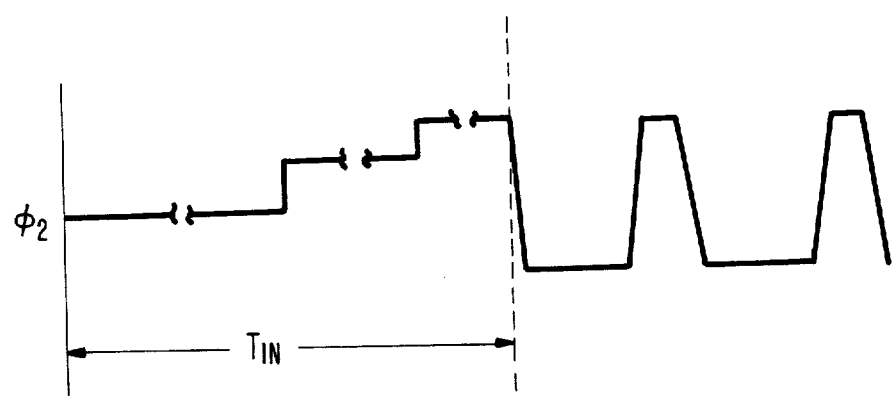
FIGS. 11–13 and 17 show other waveforms which may be employed to increase dynamic range and FIG. 13 also shows a waveform which may be employed for gamma correction.
Figure 13:
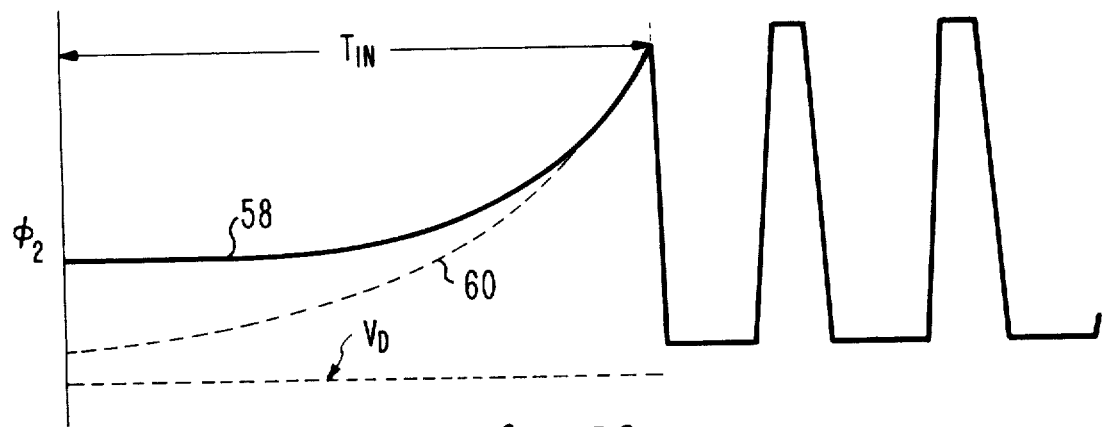

The above illustrates the simplest form of the increased dynamic range aspect of the present invention. It is to be appreciated that a more pleasing effect can be obtained by, for example, using more than two steps during the integration time as shown in FIG. 11. Indeed the closer one gets to a smooth curve such as shown in FIG. 13 at 58, the closer will be the approach to the ideal case. Of course, in many applications it is not necessary to produce a smoothly varying curve such as in FIG. 13. Rather, a stepped wave will do, especially one with sufficient steps to approach a smooth curve.

Figure 12:
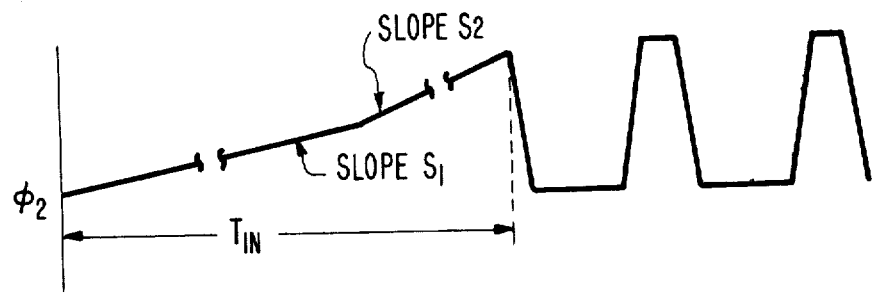

It is also possible to combine the advantages of reduced dark currents and increased dynamic range. This may be accomplished in the manner illustrated, for example, in FIG. 12. Here, during the integration time the integrating voltage $\phi_2$ consists of two linear ramps of difference slopes $S_1$ and $S_2$. Again, while the wave of FIG. 12 has only two ramps, it is possible instead to use three, four or more ramps of successively increasing slopes rather than the two shown.

FIGS. 14 and 15 illustrate yet another problem which may be dealt with according to the methods of the present invention. In an ordinary kinescope, the display brightness is not linearly proportional to the kinescope drive signal amplitude. Rather, it varies in non-linear fashion, as shown. The curve is legended $\gamma = 2$ to indicate that the brightness of the image is proportional to the square of the drive signal amplitude.

In order to compensate for the above non-linearity, it is necessary to gamma correct the signals applied to the kinescope. In other words video signals representing the brighter images are reduced in amplitude and such signals representing dimmer images are increased in amplitude in a fashion complementary to the gamma of the kinescope so that the displayed image will have a brightness which is linearly proportional to the brightness of the scene being viewed.

An imager such as a CCD imager produces outputs linearly proportional to the scene being imaged (assuming operation below blooming levels). It is possible to gamma correct the video signal obtained in the same way that video signals obtained from conventional tube type television cameras such as vidicons or plumbicons are gamma corrected. When this is done it results in amplifying the dimmer parts of the scene which include low level inherent noise components. Such low level signal variations, when amplified, appear larger relative to the larger amplitude signals derived from the brighter parts of the scene. Unfortunately, however, certain noise components such as the fixed pattern noise due to spatial variations in background dark current level are greater (at room temperature) in a CCD produced signal than, for example, in a signal produced by a plumbicon. Therefore, if gamma compensation of the conventional type is employed for gamma correcting a CCD signal, which means amplifying the low level signals and attenuating higher level signals, the low level noise signals of the CCD camera will be greatly accentuated. This, of course, is highly undesirable. (The same kind of reasoning applies to the conventional off chip methods for dynamic range compensation when applied to a CCD imager.)

According to another aspect of the present invention, gamma correction can be obtained "on chip" during the integration time by employing an appropriate integration waveform $\phi_2$. Such a waveform is illustrated by dashed curve 60 in FIG. 13. The $\phi_2$ voltage varies in non-linear fashion to cause a corresponding variation in depth of the potential wells beneath the $\phi_2$ electrodes. The result is relative accentuation of the low level signals and attenuation of the higher level signals. At the same time, dynamic range is improved in the manner already discussed. The price paid, as compared to operating at a constant integration voltage, is that more light is needed. Thus, when operating with an integrating waveform such as shown at 60, the camera aperture must be opened wider than if a constant voltage such as $V_2$ is employed.

It should be appreciated that various compromises may be made to achieve a balance of the various objectives discussed above. Thus, as one example, the wave 58 need not start at as high a level as illustrated but instead may be closer to wave 60. This would decrease the light requirements. As another example, rather than obtaining correction by gamma correcting to 0.5, exactly to compensate for the non-linearity of the kinescope as illustrated in FIG. 15, partial gamma compensation may be obtained on chip (say correction to 0.7) and the remainder of the correction achieved by external, conventional gamma compensation circuits. Moreover, one can simulate a curve such as 60 or one between 60 and 58 by employing a plurality of discrete steps (as in FIG. 11) or a plurality of ramps of different slope (as in FIG. 12).

The concept of on chip gamma correction as discussed above is very important in color cameras. The reason is that it is necessary that red, blue and green color components add properly over all brightness levels. Such on chip gamma correction can be achieved in the manner already discussed, for each of the three imagers employed for the three different colors.

While the techniques discussed herein are especially useful in CCD imagers, they may also be employed in other forms of imagers such as those employing photodiodes and blooming buses, those employing "charge injection" devices, and even tube type imagers such as silicon vidicons. These techniques are applicable to self-scanned as well as x-y addressed imagers.

In the discussion above of various embodiments of the invention which are suitable for increasing dynamic range and for gamma compensation, the depth of the potential well is changed during the integration time by changing the voltage applied to the electrodes (the $\phi_2$ electrodes in the examples discussed) under which charge collection occurs. It is to be understood that this is an example only, as the effective depth of the potential wells may be changed in other ways. One alternative structure is illustrated in FIG. 16. This FIGURE is a section transverse of the channel direction, the channel extending into the page. The structure shown in FIG. 16 includes a P-type substrate 80, a drain for charge carriers in the substrate, shown as an N-type diffusion 82, and electrodes 84, 86 and 88 over the substrate and insulated therefrom.

Assume that the operation depicted in FIG. 9 is desired. Then, during the entire integration time $T_1 + T_2$ electrode 86 is held at a fixed level such as $V_2$. During the portion $T_1$ of the integration time, electrode 84 is maintained at a relatively lower level to produce a blooming barrier 89 of the height illustrated at (a) in FIG. 16. The effect of doing this is to reduce the effective depth of the potential well to $D_1$ as illustrated in FIG. 16. Any excess charge carriers due to an intense image, overflow this barrier and pass to the drain diffusion 82.

During the second portion $T_2$ of the integration time, the voltage $V_{BB}$ is decreased (made less positive) to increase the height of the blooming barrier 89 as shown at (b) in FIG. 16 and in this way to increase the effective depth of the potential well from $D_1$ to $D_2$. Thus, the operation obtained is substantially the same as that discussed previously in connection with FIG. 9 even though $\phi_2$ is kept at a constant level during the entire integration time in FIG. 16.

It is, of course, possible to vary the potential applied to the blooming barrier electrode 84 in any other of the ways discussed previously, for example, as illustrated in FIGS. 11-13.

The electrode 88 illustrated in FIG. 16 is for the purpose of providing a so called "channel stop," that is, a potential barrier 90 for confining the charge to the channel. Alternative structures such as a P-type diffusion which is more heavily doped than the P-type substrate, could of course, be used instead to provide a suitable channel stop.

Figure 17:
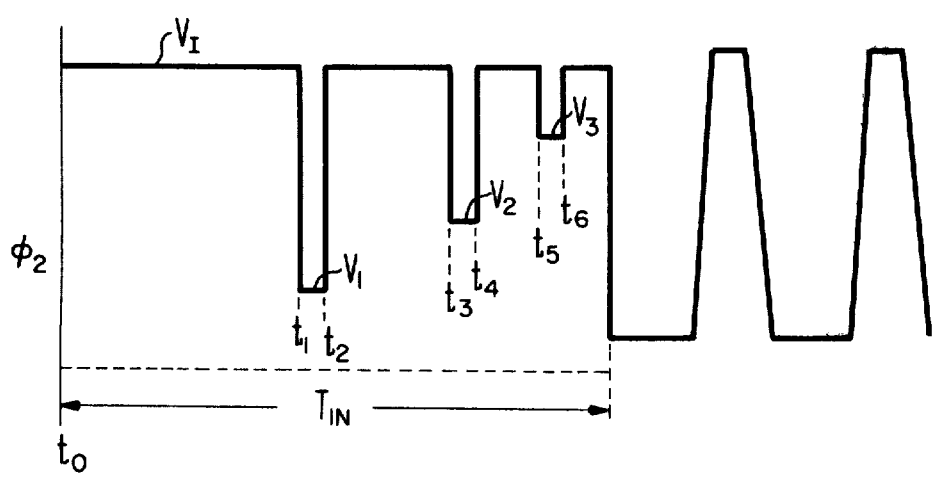

FIG. 17 illustrates yet another way for increasing the dynamic range (and is applicable also to gamma correction). Here, during the period $t_0$ to $t_1$ of the integration time, the $\phi_2$ voltage is at a level $V_1$ such as to create deep depletion regions beneath the $\phi_2$ electrodes. At time $t_1$, the $\phi_2$ voltage is decreased to a level $V_1$. If any excess charge is present in the resulting depletion regions of reduced size, that excess charge will flow to the regions of the substrate in accumulation, assuming operational blooming control as illustrated in FIG. 2. (Alternatively, structural blooming control buses could be employed.) The effect therefore is the same as would be obtained if, during the period $t_0$ to $t_2$, the voltage were at the constant level $V_1$.

From the period $t_2$ to $t_3$, the $\phi_2$ voltage returns to its initial value $V_1$ and then at time $t_3$ the voltage goes to level $V_2$ which is higher than $V_1$. Again, any excess charge which may be present due to the reduced size of the depletion region will flow to the regions of the substrate in accumulation. The effect is the same as if, during the period $t_2$ to $t_4$, the voltage were at the level $V_2$.

The remainder of the operation is believed to be self-evident. While the waveform of FIG. 17 looks considerably different than that of FIG. 11, the operation which results is substantially the same for the two different figures except that operation in the way depicted in FIG. 17 does not reduce dark currents whereas the operation shown in FIG. 11 does result in a substantial reduction in dark currents as already indicated.

While the discussion above has been in terms of increasing dynamic range, it should be appreciated that the technique of FIG. 17 also may be employed for gamma correction. This may be done by choosing appropriate values of $V_1$, $V_2$ and $V_3$ and appropriate points during the integration time during which these voltage levels are to be applied. The objective, of course, is to simulate a smooth curve such as 60 of FIG. 13. While only three notches are shown in FIG. 17, a more faithful simulation can be obtained if more than this number of notches is employed. The duration of periods such as $t_1$ and $t_2$ can be of the order of a millisecond or so; however, this time is not critical.

What is claimed is:

1. A method of operating an image sensing array which includes a substrate and electrodes insulated from the substrate to which a voltage may be applied during an integration time for causing radiation induced charge carriers to be collected in the regions of the substrate adjacent to the electrodes comprising the step of:
applying a voltage to said electrodes which increases with time for increasing in corresponding fashion the depth of the depletion regions for charge accumulation produced in the substrate.

2. A method as set forth in claim 1 wherein said step of increasing said voltage comprises linearly increasing said voltage as a function of time.

3. A method as set forth in claim 1 wherein said step of increasing said voltage comprises non-linearly increasing said voltage as a function of time.

4. A method as set forth in claim 3 wherein said step of increasing said voltage comprises increasing said voltage in discrete steps.

5. A method as set forth in claim 3 wherein said step of increasing said voltage comprises increasing said voltage in linear fashion during each of a plurality of successive time increments, the linear increase being at successively higher rates during each successive time increment.

6. A method as set forth in claim 3 wherein said step of increasing said voltage comprises increasing said voltage with time as a function of $N^M$, where N is a number greater than 1 and M is a number greater than 1.

7. A method for operating an imager having a plurality of locations, during the integration time of the imager, comprising the steps of:
producing at the respective locations of the imager, charge carriers in response to the radiation excitation reaching said locations,
during one portion of the integration time, storing at each location the charge carriers produced at that location up to a certain number and removing the charge carriers in excess of that number from each location; and
during a following portion of the integration time, storing, at each location, the additional charge carriers producted at that location during said following portion of the integration time up to a second number.

8. A method as set forth in claim 7 wherein said certain number is a constant.

9. A method as set forth in claim 7, wherein said certain number is a variable which increases as a function of time.

10. A method as set forth in claim 9, wherein said certain number is a variable which increases non-linearly with time.

11. A method as set forth in claim 9, wherein said certain number is a variable which increases linearly with time.

12. A method as set forth in claim 7 wherein said certain number and said second number are both constants.

13. A method as set forth in claim 7 wherein said certain number and said second number are both variables which increase as a function of time.

14. A method of operating an imager of the type having storage means at each location for collecting the charge carriers produced at that location in response to radiation excitation comprising the step of:
changing the capacity of the storage means during the integration time.

15. The method set forth in claim 14 wherein said step further comprises:
during one portion of the integration time, removing the excess charge signal from any location where more charge signal has been produced than can be stored in the storage means at that location;
during a following portion of the integration time, during which the capacity of the storage means at each location has been increased, collecting in the storage means at each location any additional charge signal which is produced at that location removing the excess charge signal from any location where more charge signal has been produced during said following portion of the integration time than can be stored in the storage means of increased capacity.

16. The method as set forth in claim 14 wherein the step of changing the capacity of the storage means comprises doing so non-linearly as a function of time.

17. The method as set forth in claim 16 wherein the step of changing the capacity of the storage means comprises doing so in discrete steps.

18. The method as set forth in claim 15 wherein the step of changing the capacity of the storage means comprises doing so substantially linearly as a function of time.

19. The method set forth in claim 15 wherein during said one portion of said integration time the capacity of the storage means at each location is constant at one value and during said following portion of the integration time, the capacity of the storage means at each location is constant at a second higher value.

20. The method set forth in claim 19 wherein during said one portion of said integration time, the capacity of the storage means at each location increases as a function of time and during said following portion of the integration time, the capacity of the storage means at each location increases as a function of time.

21. A method of operating an imager of the type having storage means at each location for collecting the charge carriers produced at that location in response to radiation excitation comprising the steps of:
in one period of the integration time collecting charge carriers at the storage means of each location and removing any such carriers in excess of first number; and
in a following period of the integration time, continuing to collect charge carriers at the storage means of each location and removing any such carriers in excess of a second number larger than the first.

22. The method as set forth in claim 21 wherein the steps of collecting charge carriers and removing any such charge carriers in excess of a first number comprises employing a storage means of given capacity and then reducing the capacity of the storage means while removing any excess charge carriers which exceed the capacity of the storage means of reduced size, and wherein the step during the following period comprises first increasing the capacity of the storage means at each location and then at the end of the period reducing the capacity of the storage means to a second value larger than the first reduced value and removing charges in excess of the capacity of the storage means of second reduced value.

23. A method of operating a charge coupled device imager which includes electrodes to which a voltage may be applied during the integration time for forming potential wells in the substrate and which includes also means for the control of blooming, that is, for removing any charge in excess overflowing said potential wells, comprising the steps of:

during one period of the integration time applying a voltage to said electrodes so as to create potential wells in the substrate for the collection of radiation induced charge and, at least at the end of that period, placing said voltage at a level such that the potential wells are at a depth at which charge signals from sufficiently intense radiation will overflow the wells which have accummulated such charge signals and flow to the means for controlling blooming; and during a following period of the integration time increasing the voltage applied to said electrodes and at least at the end of said following period placing said voltage at a level to obtain potential wells of a second depth, greater than the first.

24. A method of operating a CCD imager which includes a substrate and means for forming a plurality of potential wells in said substrate during the integration time for the storage of radiation induced charge carriers, and which includes also blooming control means for receiving any charge carriers which overflow said wells, the improvement comprising the step of:

changing the effective depth of said potential wells during the integration time.

25. The method of operating a CCD imager as set forth in claim 24, wherein said step comprises:

changing the effective depth of said potential wells non-linearly with time.

26. The method of operating a CCD imager as set forth in claim 25, wherein said step comprises:

increasing the effective depth of said potential wells non-linearly with time.

27. The method as set forth in claim 24, wherein said step comprises:

during successive discrete periods of the integration time making said potential wells the successively different effective depths, each greater than the preceding depth.

* * * * *